(12) United States Patent
Safai

(10) Patent No.: US 11,917,921 B2
(45) Date of Patent: Feb. 27, 2024

(54) FLEXOELECTRICITY ULTRASONIC TRANSDUCER IMAGING SYSTEM

(71) Applicant: The Boeing Company, Chicago, IL (US)

(72) Inventor: Morteza Safai, Newcastle, WA (US)

(73) Assignee: The Boeing Company, Chicago, IL (US)

( * ) Notice: Subject to any disclaimer, the term of this patent is extended or adjusted under 35 U.S.C. 154(b) by 96 days.

(21) Appl. No.: 17/580,404

(22) Filed: Jan. 20, 2022

(65) Prior Publication Data
US 2022/0231220 A1 Jul. 21, 2022

Related U.S. Application Data

(60) Provisional application No. 63/140,231, filed on Jan. 21, 2021.

(51) Int. Cl.
| | |
|---|---|
| *H04R 25/00* | (2006.01) |
| *H10N 30/857* | (2023.01) |
| *C08L 27/18* | (2006.01) |
| *H04R 17/00* | (2006.01) |
| *H10N 30/098* | (2023.01) |

(52) U.S. Cl.
CPC ............ *H10N 30/857* (2023.02); *C08L 27/18* (2013.01); *H04R 17/005* (2013.01); *H10N 30/098* (2023.02)

(58) Field of Classification Search
None
See application file for complete search history.

(56) References Cited

U.S. PATENT DOCUMENTS

| | | |
|---|---|---|
| 2005/0156362 A1 | 7/2005 | Arnold et al. |
| 2008/0015443 A1 | 1/2008 | Hosono et al. |
| 2010/0239133 A1 | 9/2010 | Schmitt et al. |
| | (Continued) | |

FOREIGN PATENT DOCUMENTS

EP 4032624 A1 * 7/2022 ............. C08L 27/18

OTHER PUBLICATIONS

US 5,744,989 A, 04/1998, Smith et al. (withdrawn)
(Continued)

*Primary Examiner* — Phylesha Dabney
(74) *Attorney, Agent, or Firm* — Haynes and Boone, LLP

(57) ABSTRACT

A flexoelectricity ultrasonic (UT) transducer imaging system is disclosed comprising a polytetrafluoroethylene (PTFE) layer, a plurality of flexoelectricity UT transducers, and a multiplexer. The PTFE layer includes a front and back surface and the plurality of flexoelectricity UT transducers is attached to the back surface of the PTFE layer. Each UT transducer has a front-end and back-end and the front-end of each flexoelectricity UT transducer is attached to the back surface of the PTFE layer. The flexoelectricity UT transducers are arranged along the back surface of the PTFE layer as a two-dimensional array and each flexoelectricity UT transducer is configured to vibrate in a normal direction to the back surface of the PTFE layer. The multiplexer in signal communication with each flexoelectricity UT transducer, where the flexoelectricity UT transducers are sandwiched between the multiplexer and the PTFE layer.

20 Claims, 8 Drawing Sheets

(56) References Cited

U.S. PATENT DOCUMENTS

2020/0046320 A1  2/2020  Wodnicki et al.

OTHER PUBLICATIONS

EP4032624-A1. Examination Response, dated Jan. 26, 2023 (Year: 2023).*
Shu et al., "Frequency dispersion of flexoelectricity in PMN-PT single crystal," AIP Advances 7, 015010 (2017), 7 pages. [retrieved on Jun. 2, 2022]. Retrieved from the Internet: <URL: https://aip.scitation.org/doi/10.1063/1.4973684>.
Gao et al., "Recent Progress on BaTiO3-Based Piezoelectric Ceramics for Actuator Applications," Actuators 2017, 6(3), 24, 20 pages. [retrieved on Jun. 2, 2022]. Retrieved from the Internet: <URL:https://www.mdpi.com/2076-0825/6/3/24/htm>.

\* cited by examiner

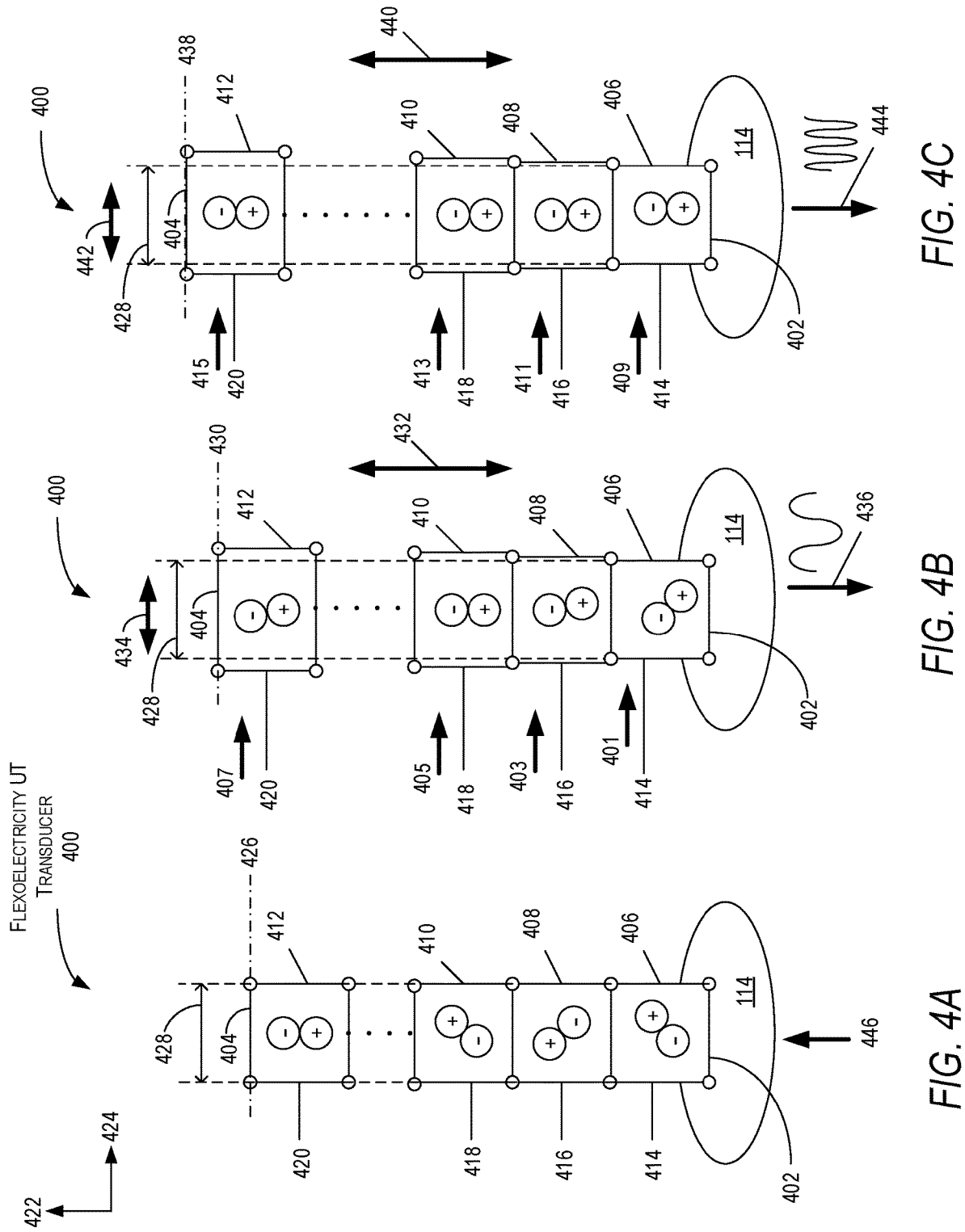

FLEXOELECTRICITY ULTRASONIC TRANSDUCER IMAGING SYSTEM

CROSS REFERENCE TO RELATED APPLICATION

This application claims priority to U.S. Provisional Patent Application No. 63/140,231, filed Jan. 21, 2021, which is incorporated by reference herein in its entirety.

BACKGROUND

1. Field

The present disclosure is related to imaging systems, and more particularly to ultrasonic imaging systems.

2. Prior Art

Known ultrasonic nondestructive testing applications utilize high-frequency sound waves for flaw detection and thickness gaging of objects and/or layers of material on the objects. These applications utilize test systems that include a plurality of ultrasonic transducers (UT transducers), where each UT transducer is generally a small probe that produces, transmits, and receives the high-frequency sound waves. These small probes may be combined to form larger phased arrays of probes that generate steered sound beams to perform the ultrasonic nondestructive testing.

Unfortunately, known UT transducers are made of piezoelectric crystals actuators. These actuators are ridge piezo crystals that require high voltages to see the changes electric polarization due to movement. Moreover, the rigidity and the size of the these known piezo crystals limit their utilization for portable UT imaging systems that can be utilized for flaw detection and thickness gagging of objects that have varying surfaces. As such, there is a need for a UT imaging sensor that addresses these issues.

SUMMARY

A flexoelectric ultrasonic (UT) transducer imaging system comprising a polytetrafluoroethylene (PTFE) layer, a plurality of flexoelectricity UT transducers, and a multiplexer is disclosed. The PTFE layer includes a front surface and a back surface and the plurality of flexoelectricity UT transducers is attached to the back surface of the PTFE layer. Each UT transducer of the plurality of flexoelectricity UT transducers has a front-end and a back-end and the front-end of each UT transducer is attached to the back surface of the PTFE layer, where the PTFE layer is configured as an audio membrane of the front-end of each UT transducer. The plurality of flexoelectricity UT transducers is arranged along the back surface of the PTFE layer as a two-dimensional array and each UT transducer is configured to vibrate in a normal direction to the back surface of the PTFE layer. The multiplexer in signal communication with each UT transducer, where the plurality of flexoelectricity UT transducers is sandwiched between the multiplexer and the PTFE layer.

In an example of operation, the flexoelectricity UT transducer imaging system is placed on a part under inspection, covering the part. A first set of voltages are applied to the plurality of flexoelectricity UT transducers with the multiplexer to produce vibrations in the plurality of flexoelectricity UT transducers. The vibrations of the plurality of flexoelectricity UT transducers and the PTFE layer produce the sounds waves that are transmitted towards the part under inspection with the PTFE layer. A plurality of reflected sound waves from the part under inspection are then received with the PTFE layer which cause the flexoelectricity UT transducers to vibrate and produce a second set of voltages that are received by the multiplexer. The multiplexer then transmits pixel data corresponding to each UT transducer within the two-dimensional array to a controller to produce a full image of the part under inspection.

Other devices, apparatuses, systems, methods, features, and advantages of the invention will be or will become apparent to one with skill in the art upon examination of the following figures and detailed description. It is intended that all such additional devices, apparatuses, systems, methods, features, and advantages be included within this description, be within the scope of the invention, and be protected by the accompanying claims.

BRIEF DESCRIPTION OF THE FIGURES

The invention may be better understood by referring to the following figures. The components in the figures are not necessarily to scale, emphasis instead being placed upon illustrating the principles of the invention. In the figures, like reference numerals designate corresponding parts throughout the different views.

FIG. 4A is a system block diagram of an example of an implementation of a UT transducer, shown in FIGS. 1-3, in the rest state in accordance with the present disclosure.

FIG. 4B is a system block diagram of the UT transducer, shown in FIGS. 1-4A, in the active low-frequency state in accordance with the present disclosure.

FIG. 4C is a system block diagram of the UT transducer, shown in FIGS. 1-4B, in the active high-frequency state in accordance with the present disclosure.

DETAILED DESCRIPTION

Disclosed is a flexoelectricity ultrasonic (UT) transducer imaging system comprising a polytetrafluoroethylene (PTFE) layer, a plurality of flexoelectricity UT transducers, and a multiplexer. The PTFE layer includes a front surface and a back surface and the plurality of flexoelectricity UT transducers is attached to the back surface of the PTFE layer. Each UT transducer of the plurality of flexoelectricity UT transducers has a front-end and a back-end and the front-end of each UT transducer is attached to the back surface of the PTFE layer, where the PTFE layer is configured as an audio membrane of the front-end of each UT transducer. The plurality of flexoelectricity UT transducers is arranged along the back surface of the PTFE layer as a two-dimensional array and each UT transducer is configured to vibrate in a normal direction to the back surface of the PTFE layer. The multiplexer in signal communication with each UT transducer, where the plurality of flexoelectricity UT transducers is sandwiched between the multiplexer and the PTFE layer.

In an example of operation, the flexoelectricity UT transducer imaging system is placed on a part under inspection, covering the part. A first set of voltages are applied to the plurality of flexoelectricity UT transducers with the multiplexer to produce vibrations in the plurality of flexoelectricity UT transducers. The vibrations of the plurality of flexoelectricity UT transducers and the PTFE layer produce the sounds waves that are transmitted towards the part under inspection with the PTFE layer. A plurality of reflected sound waves from the part under inspection are then received with the PTFE layer which cause the flexoelectricity UT transducers to vibrate and produce a second set of voltages that are received by the multiplexer. The multiplexer then transmits pixel data corresponding to each UT transducer within the two-dimensional array to a controller to produce a full image of the part under inspection.

Figure 1:
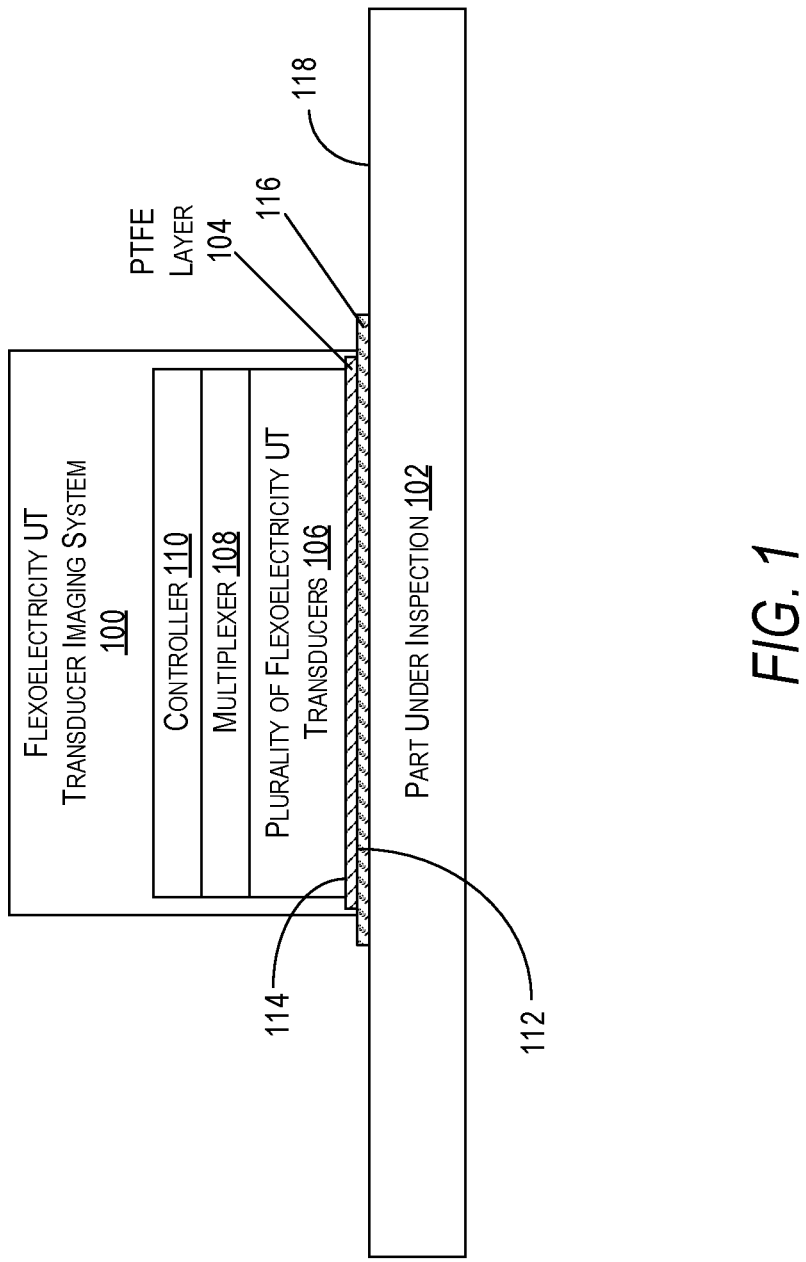
FIG. 1 is a system block diagram of an example of an implementation of a flexoelectricity UT transducer imaging system in accordance with the present disclosure.

Turning to FIG. 1, a system block diagram of an example of an implementation of the flexoelectricity UT transducer imaging system 100 is shown in accordance with the present disclosure. In this example, the flexoelectricity UT transducer imaging system 100 is placed on the on a top of part under inspection 102 that linear component. The flexoelectricity UT transducer imaging system 100 may include a polytetrafluoroethylene (PTFE) layer 104, a plurality of flexoelectricity UT transducers 106, a multiplexer 108, and a controller 110. The PTFE layer 104 includes a front surface 112 and a back surface 114 and the plurality of flexoelectricity UT transducers 106 are attached to the back surface 114 of the PTFE layer 104. In this example, each UT transducer of the plurality of flexoelectricity UT transducers 106 has a front-end and a back-end where the front-end of each UT transducer is attached to the back surface 114 of the PTFE layer 104. The PTFE layer 104 is configured as an audio membrane of the front-end of each UT transducer and the plurality of flexoelectricity UT transducers 106 is arranged along the back surface 114 of the PTFE layer 104 as a two-dimensional array. In this example, each UT transducer is configured to vibrate in a normal direction to the back surface 114 of the PTFE layer 104. In this example, the PTFE layer 104 may be placed on the part under inspection 102 utilizing a UT gel 116 to form an approximate vacuum seal between the font surface 112 of the PTFE layer 104 and the surface 118 of the part under inspection 102.

In this example, the controller 110 may be any device capable of receiving pixel data from each UT transducer in the plurality of flexoelectricity UT transducers 106 and, in response, produce a full image of the part under inspection 102, where the image may be utilized for flaw detection and thickness gaging of the part under inspection 102. The controller 110 may be, for example, a field programmable gate array (FPGA) or a computing device that includes that one or more processors that include, for example, a microprocessor, a single-core processor, a multi-core processor, a microcontroller, an application-specific integrated circuit (ASIC), a logic device (e.g., a programmable logic device configured to perform processing operations), a digital signal processing (DSP) device, one or more memories for storing executable instructions (e.g., software, firmware, or other instructions), and/or any other appropriate combination of processing device and/or memory to execute instructions to perform any of the various operations described in the memory and other devices via the one or more communication interfaces to perform method and processing steps as described herein. The one or more communication interfaces include wired or wireless communication buses.

In various examples, it is appreciated by those of ordinary skill in the art that the processing operations and/or instructions may be integrated in software and/or hardware as part of the one or more processors, or code (e.g., software or configuration data), which is stored in the memory. The examples of processing operations and/or instructions disclosed in the present disclosure may be stored by a machine-readable medium in a non-transitory manner (e.g., a memory, a hard drive, a compact disk, a digital video disk, or a flash memory) to be executed by the one or more processors (e.g., a computer such as a logic or processor-based system) to perform various methods disclosed herein. In this example, the machine-readable medium may be residing in memory within the computing device but it is appreciated by those of ordinary skill that the machine-readable medium may be located on other memory external to the controller.

In this example, the PTFE layer 104 may be implemented as, or part of, a blanket of the flexoelectricity UT transducer imaging system 100. If the blanket is separate from the PTFE layer 104, the blanket layer may be attached to the PTFE layer 104 and include a front surface and a back surface, where the PTFE layer 104 is attached to the back surface of the blanket layer, and the front surface is configured to attach to a part under inspection 102. In this example, the blanket may be a separate component to protect the structural integrity of the PTFE layer 104 or simply a flexible version of the PTFE layer 104 that extends beyond a physical footprint of the plurality of the UT transducers 106.

Moreover, the flexoelectricity UT transducer imaging system 100 may include, or be in signal communication with, a power source (not shown) to provide a set of excitation voltages to the flexoelectricity UT transducers of the plurality of flexoelectricity UT transducers 106. In this example, the power source provides voltages that, for example, may be less than approximately 80 volts.

Figure 2:
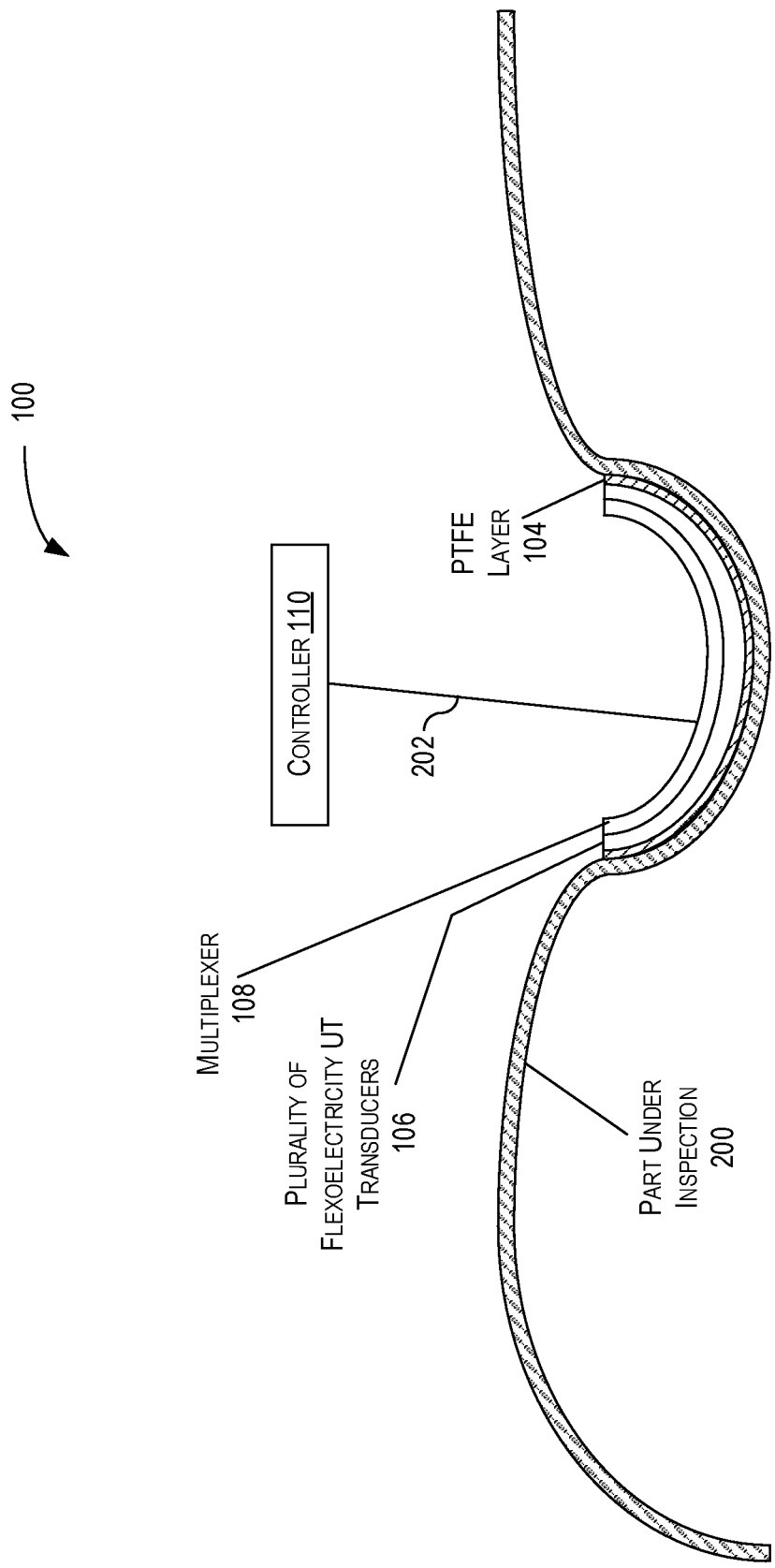
FIG. 2 is a side-view of the flexoelectricity UT transducer imaging system, shown in FIG. 1, placed on a non-linear part under inspection in accordance with the present disclosure.

FIG. 2 is a side-view of the flexoelectricity UT transducer imaging system 100 placed on a non-linear part under inspection 200 in accordance with the present disclosure. In this example, the controller 110 is shown as remote from the combination of the PTFE layer 104, plurality of flexoelectricity UT transducers 106, and multiplexer 108 but still in signal communication via signal path 202 that may be a wired or wireless connection.

It is appreciated by those of ordinary skill in the art that the circuits, components, modules, and/or devices of, or associated with, the flexoelectricity UT transducer imaging system 100 are described as being in signal communication with each other, where signal communication refers to any type of communication and/or connection between the circuits, components, modules, and/or devices that allows a circuit, component, module, and/or device to pass and/or receive signals and/or information from another circuit, component, module, and/or device. The communication and/or connection may be along any signal path between the circuits, components, modules, and/or devices that allows signals and/or information to pass from one circuit, component, module, and/or device to another and includes wireless or wired signal paths. The signal paths may be physical, such as, for example, conductive wires, electromagnetic wave guides, cables, attached and/or electromagnetic or mechanically coupled terminals, semi-conductive or dielectric materials or devices, or other similar physical connections or couplings. Additionally, signal paths may be non-physical such as free-space (in the case of electromagnetic propagation) or information paths through digital components where communication information is passed from one circuit, component, module, and/or device to another in varying digital formats, without passing through a direct electromagnetic connection.

Figure 3:
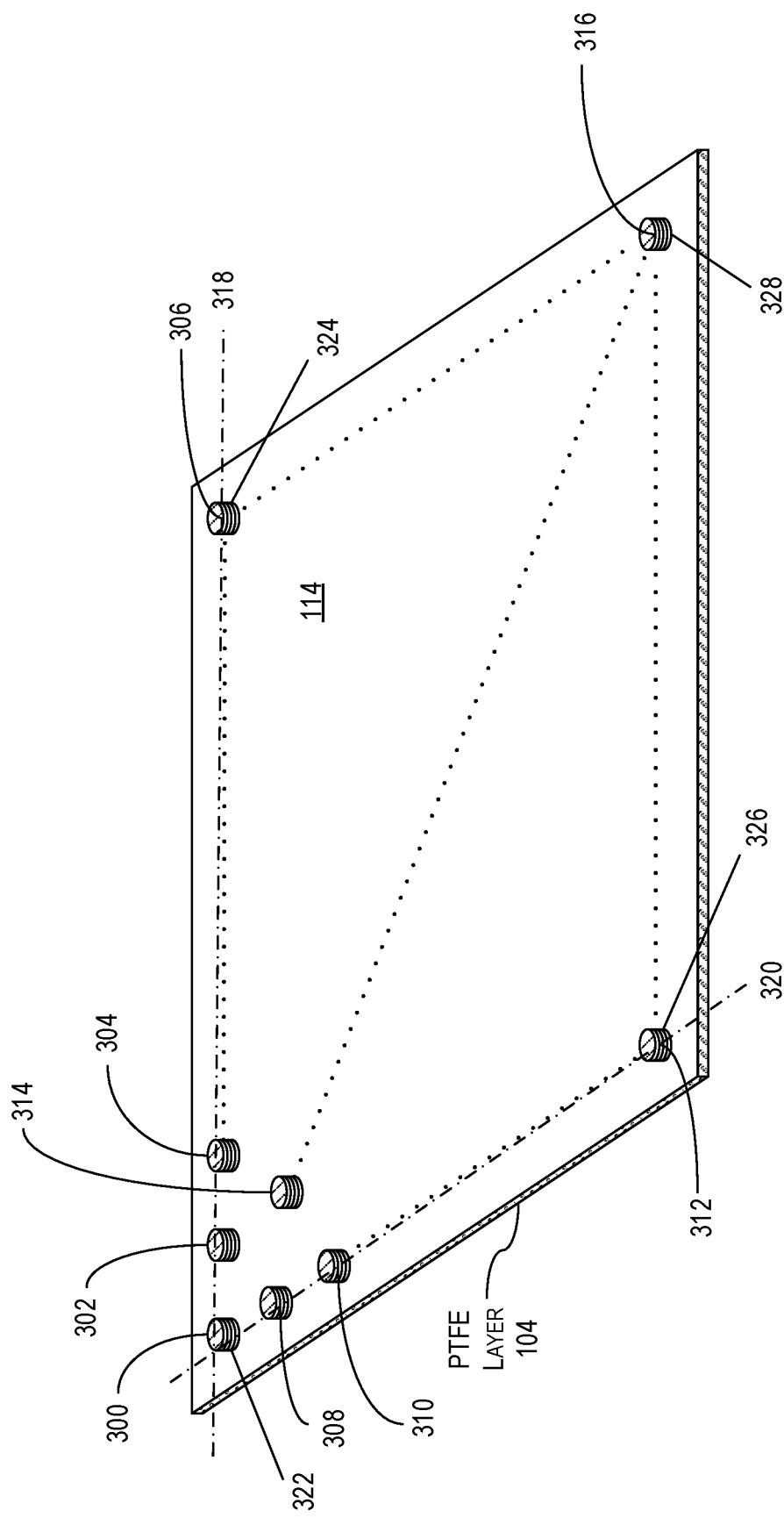
FIG. 3 is a system block diagram of an example of an implementation of a distribution of the plurality of flexoelectricity UT transducers along a back surface of the polytetrafluoroethylene (PTFE) layer shown in FIGS. 1 and 2 in accordance with the present disclosure.
Figure 4D:
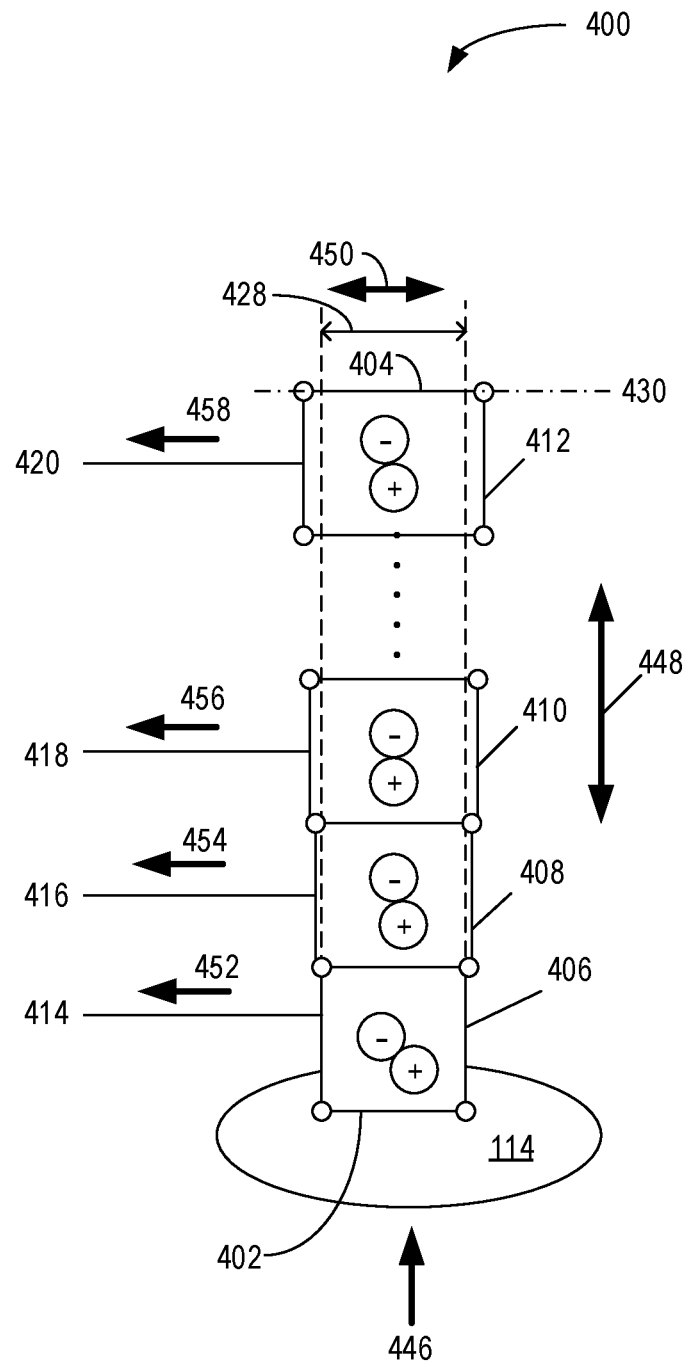
FIG. 4D is a system block diagram of the UT transducer, shown in FIGS. 1-4C, in the passive receive state in accordance with the present disclosure.

In FIG. 3, a system block diagram of an example of an implementation of a distribution of the plurality of flexoelectricity UT transducers 106 along the back surface 114 of the PTFE layer 104 is shown in accordance with the present disclosure. In this example, the plurality of flexoelectricity UT transducers 300, 302, 304, 306, 308, 310, 312, 314, and 316 are attached to the back surface 114 of the PTFE layer 104. The plurality of flexoelectricity UT transducers 300 correspond to pixel elements on of the flexoelectricity UT transducer imaging system 100 and may be oriented in rows and columns along the back surface 114 of the PTFE layer 104. As an example, the flexoelectricity UT transducers 300, 302, 304, and 306 may be oriented along a first row 318 and the flexoelectricity UT transducers 300, 308, 310, and 312 may be oriented along a first column 320. As stated earlier, the front-end of each flexoelectricity UT transducer is attached to the back surface 114 of the PTFE layer 104. As an example, the first front-end 322 of a first flexoelectricity UT transducer 300, second front-end 324 of a second flexoelectricity UT transducer 306, third front-end 326 of a third flexoelectricity UT transducer 312, and forth front-end 328 of a fourth flexoelectricity UT transducer 316 are all attached to the back surface 114 of the PTFE layer 104. In this example, the multiplexer 108 is in signal communication with each flexoelectricity UT transducers 300, 302, 304, 306, 308, 310, 312, 314, and 316 and either applies a set of voltages signals to the flexoelectricity UT transducers 300, 302, 304, 306, 308, 310, 312, 314, and 316 or receives another set of voltages signals from the flexoelectricity UT transducers 300, 302, 304, 306, 308, 310, 312, 314, and 316 when received sound waves at the PTFE layer 104 are detected by the flexoelectricity UT transducers 300, 302, 304, 306, 308, 310, 312, 314, and 316.

As discussed earlier, the plurality of flexoelectricity UT transducers 300, 302, 304, 306, 308, 310, 312, 314, and 316 are arranged as a two-dimensional array on the back surface 114 of the PTFE layer 104, where each flexoelectricity UT transducer 300, 302, 304, 306, 308, 310, 312, 314, and 316 corresponds to a pixel of the two-dimensional array. In this example, the size of the two-dimensional array may optionally vary based on the design preferences of the flexoelectricity UT transducer imaging system 100. As an example, the two-dimensional array may be as small as a 2 by 2 array and as large as a needed such as, for example, a 1,000 by 1,000 array or larger. As such, the number of flexoelectricity UT transducers may vary from four (4) to millions of elements.

Turning to FIGS. 4A-4D, a flexoelectricity UT transducer 400 of the plurality of flexoelectricity UT transducers 106 is shown. In this example, the flexoelectricity UT transducer 400 is shown in resting state in FIG. 4A, an active low-frequency state in FIG. 4B, an active high-frequency state in FIG. 4C, and a passive receiving state in FIG. 4D. In this example, the flexoelectricity UT transducer includes a front-end 402 and a back-end 404. The front-end 402 of the flexoelectricity UT transducer 400 is attached to the back surface 114 of the PTFE layer 104. The flexoelectricity UT transducer 400 may include and be constructed of one or more flexoelectricity crystal elements 406, 408, 410, and 412.

In this example, for the purpose of illustration, only four flexoelectricity crystal elements 406, 408, 410, and 412 are shown, however, it is appreciated by those of ordinary skill in the art that any number of flexoelectricity crystal elements 406, 408, 410, and 412 may be utilized in forming flexoelectricity UT transducer 400 where the plurality of flexoelectricity crystal elements is arranged as in a stacked-up structure as shown. As such, in this example the front-end 402 of the flexoelectricity UT transducer 400 corresponds to the front-end of the first flexoelectricity crystal elements 406. In this example, each flexoelectricity crystal elements 406, 408, 410, and 412 is in signal communication with the multiplexer 108 via a plurality of signal paths 414, 416, 418, and 420, respectively. Moreover, in this example, each of the flexoelectricity crystal elements 406, 408, 410, and 412 may be constructed of a polarized ceramic material such as, for example, Barium Titanate ($BaTiO_3$). Furthermore, in this example, the front-end 402 of the flexoelectricity UT transducer 400 has a corresponding front-end impedance that is matched to a PTFE impedance of the PTFE layer 104.

The polarized ceramic material of the flexoelectricity crystal elements 406, 408, 410, and 412 reacts to applied voltages to align themselves along the applied voltage such that when voltages are applied to the flexoelectricity crystal elements 406, 408, 410, and 412, the polarized ceramic material of the flexoelectricity crystal elements 406, 408, 410, and 412 will align and expand in both a vertical direction 422 and horizontal direction 424.

In an example of operation for transmitting, initially the flexoelectricity UT transducer 400 is in a resting where no voltage is applied to the flexoelectricity crystal elements 406, 408, 410, and 412. The flexoelectricity UT transducer 400 will have an initial height 426 and initial width 428. When a first set of voltages are applied in a low-frequency mode, the polarize material within flexoelectricity crystal elements 406, 408, 410, and 412 will align itself along the applied first set of applied voltages such that flexoelectricity UT transducer 400 will increase in height to a second height 430 and increase the width of some of the flexoelectricity crystal elements 406, 408, 410, and 412 to be greater than the initial width 428. When the applied first set of voltages are removed, the flexoelectricity crystal elements 406, 408, 410, and 412 will return to the resting state shown in FIG. 4A. By applying alternating current (AC) voltages 401, 403, 405, and 407 to the flexoelectricity crystal elements 406, 408, 410, and 412, the flexoelectricity UT transducer 400 may vertically vibrate 432 (in a normal direction, i.e., perpendicular to the back surface 114 of the PTFE layer 104) and horizontally vibrate 434. These vertical 432 and horizontal 434 vibrations will produce mechanical forces on the back surface 114 of the PTFE layer 104 producing low-frequency vibrations 436 of sound waves which are transmitted to the part under inspection 102 by the PTFE layer 104.

If the applied voltages are increased in the high-frequency mode, a second set of voltages 409, 411, 413, and 415 are applied in the high-frequency mode, the polarize material within flexoelectricity crystal elements 406, 408, 410, and 412 will further align itself along the applied second set of applied voltages such that flexoelectricity UT transducer 400 will further increase in height to a third height 438 and further increase the width of some of the flexoelectricity crystal elements 406, 408, 410, and 412 to be greater than the initial width 428. Again, when the applied second set of voltages are removed, the flexoelectricity crystal elements 406, 408, 410, and 412 will return to the resting state shown in FIG. 4A. By applying AC voltages for the second set of applied voltages to the flexoelectricity crystal elements 406, 408, 410, and 412, the flexoelectricity UT transducer 400 will vertically vibrate 440 and horizontally vibrate 442 stronger than the example in FIG. 4B. These vertical 440 and horizontal 442 vibrations will again produce mechanical forces on the back surface 114 of the PTFE layer 104 producing high-frequency vibrations 444 of sound waves which are transmitted to the part under inspection 102 by the PTFE layer 104.

In an example of operation for receiving reflected sound waves 446, the reverse process occurs. The flexoelectricity UT transducer 400 receives the received reflected sound waves 446 at the front source 112 of the PTFE layer 104. The received reflected sound waves 446 cause deflections to the PTFE layer 104 that cause the flexoelectricity UT transducer 400 to deflect since it is attached to the back surface 114 of the PTFE layer 104. The deflection of the PTFE layer 104 will cause the flexoelectricity UT transducer 400 to vibrate vertically 448 and horizontally 450 which will induce a first voltage 452 from the first flexoelectricity crystal elements 406, a second voltage 454 from the second flexoelectricity crystal elements 408, a third voltage 456 from the third flexoelectricity crystal elements 410, and a fourth voltage 458 from the fourth flexoelectricity crystal elements 412. These voltages will be received by the multiplexer 108 and passed to the controller 110.

In this example, it is noted that the multiplexer 108 may be configured to drive or receive a very large number of voltages because the multiplexer 108 is in signal communication with each flexoelectricity crystal elements 406, 408, 410, and 412 of each UT transducer 400 in an M by N two-dimensional array of flexoelectricity UT transducers 300, 302, 304, 306, 308, 310, 312, 314, and 316 that may be over a million, where M is the number of flexoelectricity UT transducers 300, 302, 304, and 306 along the row 318 and N is the number of flexoelectricity UT transducers 300, 306, 310, and 312 along the column 320.

Figure 5:
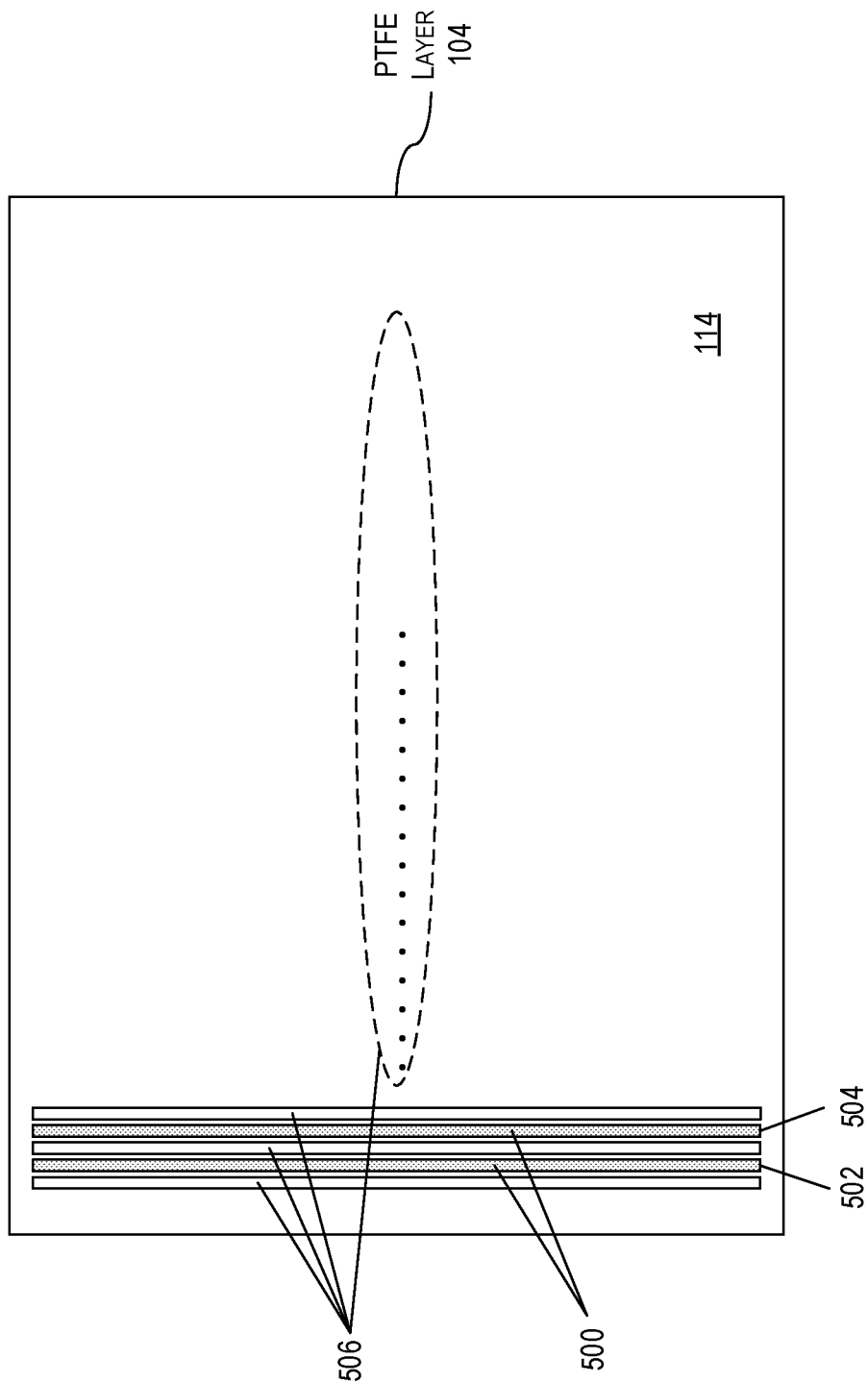
FIG. 5 is a system block diagram of an example of an implementation of the flexoelectricity UT transducer imaging system, shown in FIGS. 1-2, operating in a first mode of operation in accordance with the present disclosure.

FIG. 5 is a system block diagram of an example of an implementation of the flexoelectricity UT transducer imaging system 100 operating in a first mode of operation in accordance with the present disclosure. In this example, the plurality of flexoelectricity UT transducers 300, 302, 304, 306, 308, 310, 312, 314, and 316 are arranged into sub-pluralities, where the sub-pluralities are columns along the back surface 114 of the PTFE layer 104. Moreover, in this example, a first sub-plurality 500 of the flexoelectricity UT transducers may include two columns 502 and 504 of flexoelectricity UT transducers. The second sub-plurality 506 of the flexoelectricity UT transducers may include all of the other flexoelectricity UT transducers not included in the first sub-plurality 500 of the flexoelectricity UT transducers. For purpose of ease of illustration only two the flexoelectricity UT transducers 502 and 504 are shown in the first sub-plurality 500, however, it is appreciated that the number of flexoelectricity UT transducers within the first sub-plurality 500 may vary based on the design.

In this example, the flexoelectricity UT transducers 502 and 504 in combination with the PTFE layer 104 produce a plurality of sound waves that transmitted towards the part under inspection 102. The resulting reflected sound waves from the part under inspection 102 are received by the second sub-plurality 506 of the flexoelectricity UT transducers and not the flexoelectricity UT transducers 502 and 504 of the first sub-plurality 500 of the flexoelectricity UT transducers. In this example, the individual flexoelectricity UT transducers within the second sub-plurality 506 of the flexoelectricity UT transducers produce a set of voltages that are received by the multiplexer 108.

Figure 6:
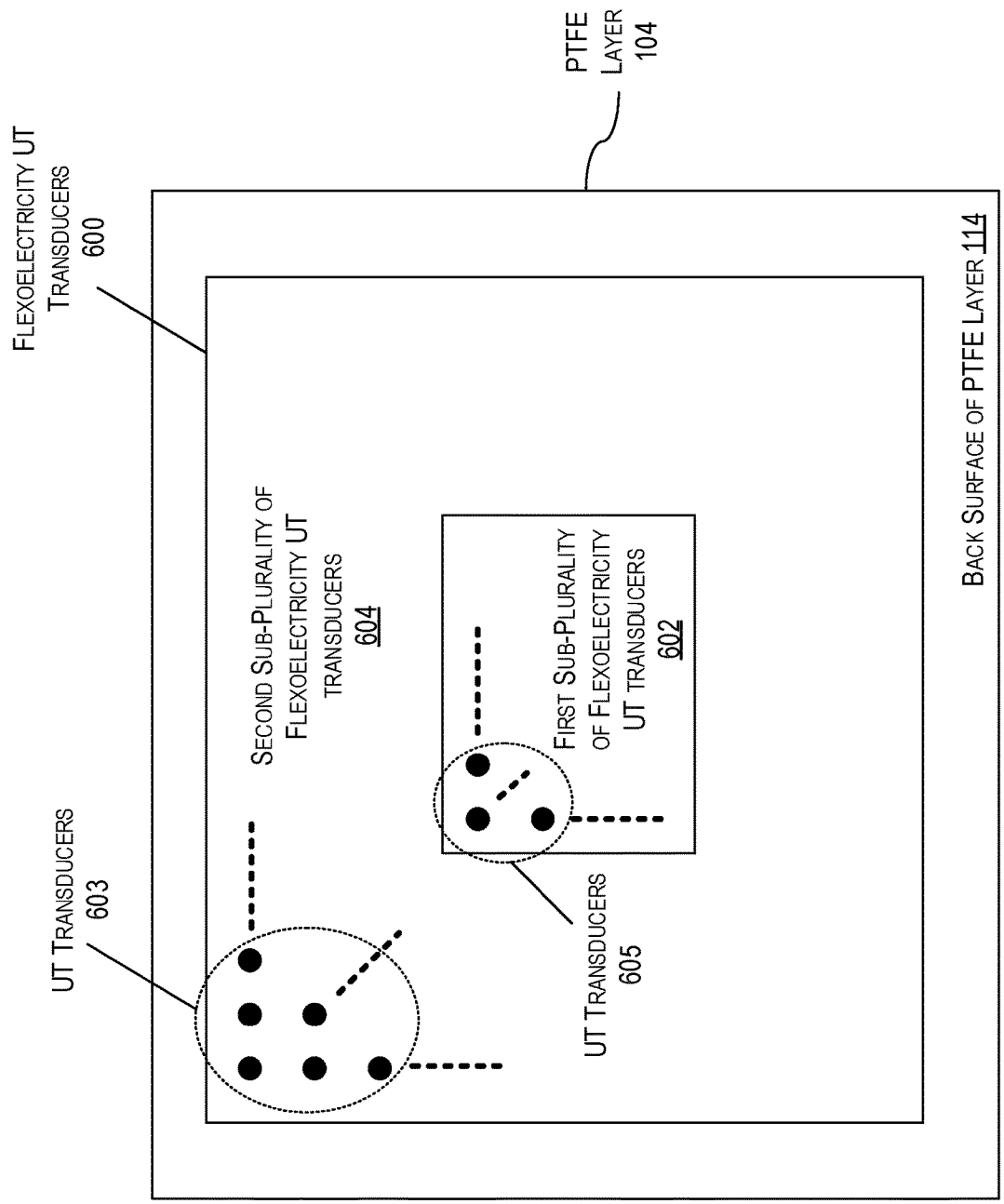
FIG. 6 is a system block diagram of the flexoelectricity UT transducer imaging system, shown in FIGS. 1-2, operating in another mode of operation in accordance with the present disclosure.

Turning to FIG. 6, a system block diagram of the flexoelectricity UT transducer imaging system 100 is shown operating in another mode of operation in accordance with the present disclosure. In this example, the plurality of flexoelectricity UT transducers 106 is arranged as a two-dimensional array of flexoelectricity UT transducers 600 where some of the flexoelectricity UT transducers (i.e., a first sub-plurality) are utilized to produce the sound waves that are transmitted to the part under inspection 102. This first sub-plurality 602 of flexoelectricity UT transducers 603 is located, for example, at the center of the two-dimensional array of flexoelectricity UT transducers 600. In this example, a second sub-plurality 604 of flexoelectricity UT transducers 605 includes all of the flexoelectricity UT transducers in the two-dimensional array of flexoelectricity UT transducers 600 excluding the first sub-plurality 602 of flexoelectricity UT transducers.

Similar to the previous example, in this example, the flexoelectricity UT transducers of the first sub-plurality 602 of flexoelectricity UT transducers in combination with the PTFE layer 104 produce a plurality of sound waves that transmitted towards the part under inspection 102. The resulting reflected sound waves from the part under inspection 102 are received by the second sub-plurality 604 of the flexoelectricity UT transducers and not the flexoelectricity UT transducers of the first sub-plurality 602 of the flexoelectricity UT transducers. Again, the individual flexoelectricity UT transducers within the second sub-plurality 602 of the flexoelectricity UT transducers produce a set of voltages that are received by the multiplexer 108.

It is appreciated that other combinations may also be utilized by the flexoelectricity UT transducer imaging system 100. In these examples, the controller 110 may be programmed to utilize different combinations for different measurements based on the part under inspection 102 or other factors.

Figure 7:
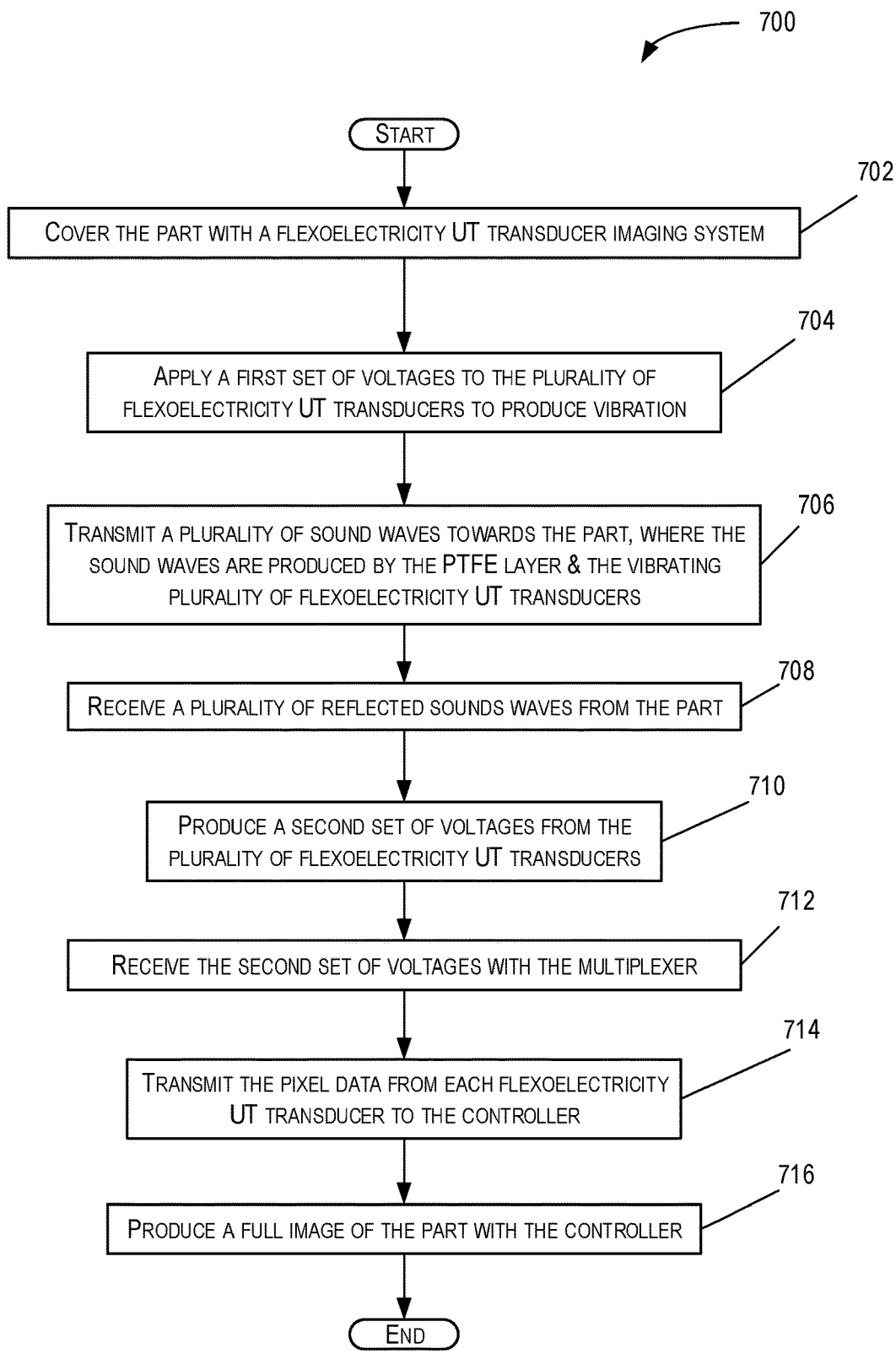
FIG. 7 is a flowchart of an example of an implementation of a method performed by the flexoelectricity UT transducer imaging system shown in FIGS. 1-2 in accordance with the present disclosure.

In FIG. 7, a flowchart of an example of an implementation of the method 700 performed by the flexoelectricity UT transducer imaging system 100 is shown accordance with the present disclosure. The method 700 begins by covering 702 the part under inspection 102 with the flexoelectricity UT transducer imaging system 100 and applying 704 a first set of voltages 401, 403, 405, 407, 409, 411, 413, 415 to the plurality of flexoelectricity UT transducers 106 with the multiplexer 108 to produce vibrations in the plurality of flexoelectricity UT transducers 106. The method 700 then includes transmitting 706 a plurality of sound waves 436 or 444 towards the under inspection 102 with the PTFE layer 104, where the plurality of sound waves 436 or 444 are produced by a combination of the PTFE layer 104 and the vibrations of the plurality of flexoelectricity UT transducers 106. The method 700 then includes receiving 708 a plurality of reflected sound waves 446 from the part under inspection 102 with the PTFE layer 104 and producing 710 a second set of voltages from the plurality of flexoelectricity UT transducers 106 that are received 712 by the multiplexer 108. The method 700 then includes transmitting 714 the pixel data from each flexoelectricity UT transducer 300, 302, 304, 306, 308, 310, 312, 316, or 400 to the controller 110 to produce a full image of the part under inspection 102 and producing 716 the full image with the controller 110. The method then ends.

In this example, the step of producing 710 a second set of voltages from the plurality of flexoelectricity UT transducers 106 includes producing a sub-set of voltages 452, 454, 456, and 458 from each flexoelectricity crystal element 406, 408, 410, and 412 of each flexoelectricity UT transducer 300, 302, 304, 306, 308, 310, 312, 316, or 400. Moreover, the step of receiving 712 the second set of voltages from the plurality of flexoelectricity UT transducers 106 with the multiplexer 108 includes receiving the sub-set of voltages 452, 454, 456, and 458 from each flexoelectricity crystal element 406, 408, 410, and 412 of each flexoelectricity UT transducer 300, 302, 304, 306, 308, 310, 312, 316, or 400.

In the method 700, the transmitting step 706 may also include producing the plurality of sound waves 436 or 444 from a combination of the PTFE layer 104 and the vibration of a first sub-plurality 500 or 602 of the flexoelectricity UT transducers 106, receiving the plurality of reflected sound waves 446 from the part under inspection 102 with the PTFE layer 104 and a second sub-plurality 506 or 602 of flexoelectricity UT transducers 106, and producing the second set of voltages from the second sub-plurality 506 or 602 of flexoelectricity UT transducers 106. In this example, the first sub-plurality 500 or 602 of the flexoelectricity UT transducers 106 has a pattern within the two-dimensional array 600. In this example, the first set of voltages 401, 403, 405, 407, 409, 411, 413, 415 may be less than approximately 80 volts.

Further, the disclosure comprises the following examples, whereby the scope of protection is provided by the claims.

Example 1. A flexoelectricity ultrasonic (UT) transducer imaging system 100 comprising: a polytetrafluoroethylene (PTFE) layer 104 having a front surface 112 and a back surface 114; a plurality of flexoelectricity UT transducers 106 attached to the back surface 114 of the PTFE layer 104, wherein each flexoelectricity UT transducer 300, 302, 304, 306, 308, 310, 312, 316, 400 of the plurality of flexoelectricity UT transducers 106 has a front-end 322, 324, 326, 328, 402 and a back-end 404, the front-end 322, 324, 326, 328, 402 of each flexoelectricity UT transducer 300, 302, 304, 306, 308, 310, 312, 316, 400 is attached to the back surface 114 of the PTFE layer 104, wherein the PTFE layer 104 is configured as an audio membrane of the front-end 322, 324, 326, 328, 402 of each flexoelectricity UT transducer 300, 302, 304, 306, 308, 310, 312, 316, 400, the plurality of flexoelectricity UT transducers 106 is arranged along the back surface 114 of the PTFE layer 104 as a two-dimensional array, and each flexoelectricity UT transducer 300, 302, 304, 306, 308, 310, 312, 316, 400 is configured to vibrate in a normal direction to the back surface 114 of the PTFE layer 104; and a multiplexer 108 in signal communication with each flexoelectricity UT transducer 300, 302, 304, 306, 308, 310, 312, 316, 400, wherein the plurality of flexoelectricity UT transducers 106 is sandwiched between the multiplexer 108 and the PTFE layer 104.

Example 2. The flexoelectricity UT transducer imaging system 100 of example 1, wherein each flexoelectricity UT transducer 300, 302, 304, 306, 308, 310, 312, 316, 400 of the plurality of flexoelectricity UT transducers 106 is a constructed of a flexoelectricity crystal element 406, 408, 410, 412.

Example 3. The flexoelectricity UT transducer imaging system 100 of example 2, wherein the flexoelectricity crystal element 406, 408, 410, 412 is a Barium Titanate (BaTiO$_3$) crystal element.

Example 4. The flexoelectricity UT transducer imaging system 100 of example 2 or 3, wherein each flexoelectricity UT transducer 300, 302, 304, 306, 308, 310, 312, 316, 400 comprises a plurality of flexoelectricity crystal elements 406, 408, 410, 412 arranged in a stacked-up structure.

Example 5. The flexoelectricity UT transducer imaging system 100 of example 4, wherein the multiplexer 108 is in signal communication with each flexoelectricity UT transducer 300, 302, 304, 306, 308, 310, 312, 316, 400 of the plurality of flexoelectricity UT transducers 106.

Example 6. The flexoelectricity UT transducer imaging system 100 of example 5, wherein the multiplexer 108 is in signal communication with each flexoelectricity crystal element 406, 408, 410, 412 of the plurality of flexoelectricity crystal elements 300, 302, 304, 306, 308, 310, 312, 316, 400.

Example 7. The flexoelectricity UT transducer imaging system 100 of example 1, wherein the front-end 322, 324, 326, 328, 402 of each flexoelectricity UT transducer 300, 302, 304, 306, 308, 310, 312, 316, 400 has a corresponding front-end impedance, the PTFE layer 104 has a PTFE impedance, and the corresponding front-end impedance for each flexoelectricity UT transducer and the PTFE impedance are matched.

Example 8. The flexoelectricity UT transducer imaging system 100 of example 1, further comprising a blanket layer attached to the PTFE layer 104, wherein the blanket layer includes a front surface and a back surface, the PTFE layer 104 is attached to the back surface of the blanket layer, and the front surface is configured to attach to a part under inspection 102.

Example 9. The flexoelectricity UT transducer imaging system 100 of example 1, further comprising a controller 110 in signal communication with the multiplexer 108.

Example 10. The flexoelectricity UT transducer imaging system 100 of example 9, wherein each flexoelectricity UT transducer 300, 302, 304, 306, 308, 310, 312, 316, 400 of the plurality of flexoelectricity UT transducers 106 corresponds to a pixel of the two-dimensional array and the controller 110 is configured to receive pixel data from each flexoelectricity UT transducer 300, 302, 304, 306, 308, 310, 312, 316, 400 and, in response, produce a full image of a part under inspection 102.

Example 11. A method for inspecting a part under inspection 102 utilizing the flexoelectricity UT transducer imaging system 100 of example 1.

Example 12. A method 700 for inspecting a part 102 with a flexoelectricity UT transducer imaging system 100, the method 700 comprising: covering 702 the part 102 with the flexoelectricity UT transducer imaging system 100 having a polytetrafluoroethylene (PTFE) layer 104, a plurality of flexoelectricity UT transducers 106 attached to a back surface 114 of the PTFE layer 104, and a multiplexer 108 in signal communication with each flexoelectricity UT transducer 300, 302, 304, 306, 308, 310, 312, 316, 400 of the plurality of flexoelectricity UT transducers 106, wherein the plurality of flexoelectricity UT transducers 106 is sandwiched between the multiplexer 108 and the PTFE layer 104 and the plurality of flexoelectricity UT transducers 106 is arranged along the back surface 114 of the PTFE layer 104 as a two-dimensional array, wherein each flexoelectricity UT transducer 300, 302, 304, 306, 308, 310, 312, 316, 400 corresponds to a pixel of the two-dimensional array; applying 704 a first set of voltages 401, 403, 405, 407, 409, 411, 413, 415 to the plurality of flexoelectricity UT transducers 106 with the multiplexer 108 to produce vibrations in the plurality of flexoelectricity UT transducers 106; transmitting 706 a plurality of sound waves 436, 444 towards the part 102 with the PTFE layer 104, wherein the plurality of sound waves 436, 444 are produced by a combination of the PTFE layer 104 and the vibrations of the plurality of flexoelectricity UT transducers 106; receiving 708 a plurality of reflected sound waves 446 from the part 102 with the PTFE layer 104; producing 710 a second set of voltages from the plurality of flexoelectricity UT transducers 106; receiving 712 the second set of voltages from the plurality of flexoelectricity UT transducers 106 with the multiplexer 108; and transmitting 714 the pixel data from each flexoelectricity UT transducer 300, 302, 304, 306, 308, 310, 312, 316, 400 to a controller 110 to produce a full image of the part 102.

Example 13. The method 700 of example 12, wherein each flexoelectricity UT transducer 300, 302, 304, 306, 308, 310, 312, 316, 400 of the plurality of flexoelectricity UT transducers 106 is a constructed of a flexoelectricity crystal element 406, 408, 410, 412.

Example 14. The method 700 of example 13, wherein the flexoelectricity crystal element 406, 408, 410, 412 is a Barium Titanate (BaTiO$_3$) crystal element.

Example 15. The method 700 of example 13, wherein each flexoelectricity UT transducer 300, 302, 304, 306, 308, 310, 312, 316, 400 comprises a plurality of flexoelectricity crystal elements 406, 408, 410, 412 arranged in a stacked-up structure, and wherein producing a second set of voltages from the plurality of flexoelectricity UT transducers 106 includes producing a sub-set of voltages 452, 454, 456, 458 from each flexoelectricity crystal element 406, 408, 410, 412 of each flexoelectricity UT transducer 300, 302, 304, 306, 308, 310, 312, 316, 400.

Example 16. The method 700 of example 15, wherein the multiplexer 108 is in signal communication with each flexoelectricity UT transducer 300, 302, 304, 306, 308, 310, 312, 316, 400 of the plurality of flexoelectricity UT transducers 106, and wherein receiving the second set of voltages from the plurality of flexoelectricity UT transducers 106 with the multiplexer 108 includes receiving the sub-set of voltages 452, 454, 456, 458 from each flexoelectricity crystal element 406, 408, 410, 412 of each flexoelectricity UT transducer 300, 302, 304, 306, 308, 310, 312, 316, 400.

Example 17. The method 700 of example 12, wherein transmitting a plurality of sound waves 436, 444 towards the part 102 with the PTFE layer 104 includes producing the plurality of sound waves 436, 444 from a combination of the PTFE layer 104 and the vibration of a first sub-plurality 500 of the flexoelectricity UT transducers 106, receiving the plurality of reflected sound waves 446 from the part 102 with the PTFE layer 104, and producing the second set of voltages from a second sub-plurality of flexoelectricity UT transducers 106.

Example 18. The method 700 of example 17, wherein the first sub-plurality of the flexoelectricity UT transducers 106 have a pattern within the two-dimensional array.

Example 19. The method 700 of example 12, further including receiving with the controller 110 pixel data from each flexoelectricity UT transducer 300, 302, 304, 306, 308, 310, 312, 316, 400 and, in response, produce a full image of the part under inspection 102.

Example 20. The method 700 of example 12, wherein the first set of voltages 401, 403, 405, 407, 409, 411, 413, 415 are less than approximately 80 volts.

It will be understood that various aspects or details of the disclosure may be changed without departing from the scope of the disclosure. It is not exhaustive and does not limit the claimed disclosures to the precise form disclosed. Furthermore, the foregoing description is for the purpose of illustration only, and not for the purpose of limitation. Modifications and variations are possible in light of the above description or may be acquired from practicing the disclosure. The claims and their equivalents define the scope of the disclosure. Moreover, although the techniques have been described in language specific to structural features and/or methodological acts, it is to be understood that the appended claims are not necessarily limited to the features or acts described. Rather, the features and acts are described as example implementations of such techniques.

To the extent that terms "includes," "including," "has," "contains," and variants thereof are used herein, such terms are intended to be inclusive in a manner similar to the term "comprises" as an open transition word without precluding any additional or other elements. Moreover, conditional language such as, among others, "can," "could," "might" or "may," unless specifically stated otherwise, are understood within the context to present that certain examples include, while other examples do not include, certain features, elements and/or steps. Thus, such conditional language is not generally intended to imply that certain features, elements and/or steps are in any way required for one or more examples or that one or more examples necessarily include logic for deciding, with or without user input or prompting, whether certain features, elements and/or steps are included or are to be performed in any particular example. Conjunctive language such as the phrase "at least one of X, Y or Z," unless specifically stated otherwise, is to be understood to present that an item, term, etc. may be either X, Y, or Z, or a combination thereof.

In some alternative examples of implementations, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram. Moreover, the operations of the example processes are illustrated in individual blocks and summarized with reference to those blocks. The processes are illustrated as logical flows of blocks, each block of which can represent one or more operations that can be implemented in hardware, software, or a combination thereof. In the context of software, the operations represent computer-executable instructions stored on one or more computer-readable medium that, when executed by one or more processing units, enable the one or more processing units to perform the recited operations. Generally, computer-executable instructions include routines, programs, objects, modules, components, data structures, and the like that perform particular functions or implement particular abstract data types. The order in which the operations are described is not intended to be construed as a limitation, and any number of the described operations can be executed in any order, combined in any order, subdivided into multiple sub-operations, and/or executed in parallel to implement the described processes. The described processes can be performed by resources associated with one or more device(s) such as one or more internal or external CPUs or GPUs, and/or one or more pieces of hardware logic such as FPGAs, DSPs, or other types of accelerators.

All of the methods and processes described above may be embodied in, and fully automated via, software code modules executed by one or more general purpose computers or processors. The code modules may be stored in any type of computer-readable storage medium or other computer storage device. Some or all of the methods may alternatively be embodied in specialized computer hardware.

What is claimed is:

1. A flexoelectricity ultrasonic (UT) transducer imaging system comprising:
a polytetrafluoroethylene (PTFE) layer having a front surface and a back surface;
a plurality of flexoelectricity UT transducers attached to the back surface of the PTFE layer, wherein
each flexoelectricity UT transducer of the plurality of flexoelectricity UT transducers has a front-end and a back-end,
the front-end of each flexoelectricity UT transducer is attached to the back surface of the PTFE layer, wherein the PTFE layer is configured as an audio membrane of the front-end of each flexoelectricity UT transducer,
the plurality of flexoelectricity UT transducers is arranged along the back surface of the PTFE layer as a two-dimensional array, and
each flexoelectricity UT transducer is configured to vibrate in a normal direction to the back surface of the PTFE layer; and
a multiplexer in signal communication with each flexoelectricity UT transducer, wherein the plurality of flexoelectricity UT transducers is sandwiched between the multiplexer and the PTFE layer.

2. The flexoelectricity UT transducer imaging system of claim 1, wherein each flexoelectricity UT transducer of the plurality of flexoelectricity UT transducers is a constructed of a flexoelectricity crystal element.

3. The flexoelectricity UT transducer imaging system of claim 2, wherein the flexoelectricity crystal element is a Barium Titanate (BaTiO$_3$) crystal element.

4. The flexoelectricity UT transducer imaging system of claim 2, wherein each flexoelectricity UT transducer comprises a plurality of flexoelectricity crystal elements arranged in a stacked-up structure.

5. The flexoelectricity UT transducer imaging system of claim 4, wherein the multiplexer is in signal communication with each flexoelectricity UT transducer of the plurality of flexoelectricity UT transducers.

6. The flexoelectricity UT transducer imaging system of claim 5, wherein the multiplexer is in signal communication with each flexoelectricity crystal element of the plurality of flexoelectricity crystal elements.

7. The flexoelectricity UT transducer imaging system of claim 1, wherein
the front-end of each flexoelectricity UT transducer has a corresponding front-end impedance,
the PTFE layer has a PTFE impedance, and
the corresponding front-end impedance for each flexoelectricity UT transducer and the PTFE impedance are matched.

8. The flexoelectricity UT transducer imaging system of claim 1, further comprising a blanket layer attached to the PTFE layer, wherein
the blanket layer includes a front surface and a back surface,
the PTFE layer is attached to the back surface of the blanket layer, and
the front surface is configured to attach to a part under inspection.

9. The flexoelectricity UT transducer imaging system of claim 1, further comprising a controller in signal communication with the multiplexer.

10. The flexoelectricity UT transducer imaging system of claim 9, wherein
each flexoelectricity UT transducer of the plurality of flexoelectricity UT transducers corresponds to a pixel of the two-dimensional array and
the controller is configured to receive pixel data from each flexoelectricity UT transducer and, in response, produce a full image of a part under inspection.

11. A method for inspecting a part under inspection utilizing the flexoelectricity UT transducer imaging system of claim 1.

12. A method for inspecting a part with a flexoelectricity UT transducer imaging system, the method comprising:
covering the part with the flexoelectricity UT transducer imaging system having a polytetrafluoroethylene (PTFE) layer, a plurality of flexoelectricity UT transducers attached to a back surface of the PTFE layer, and a multiplexer in signal communication with each flexoelectricity UT transducer of the plurality of flexoelectricity UT transducers, wherein the plurality of flexoelectricity UT transducers is sandwiched between the multiplexer and the PTFE layer and the plurality of flexoelectricity UT transducers is arranged along the back surface of the PTFE layer as a two-dimensional array, wherein each flexoelectricity UT transducer corresponds to a pixel of the two-dimensional array;
applying a first set of voltages to the plurality of flexoelectricity UT transducers with the multiplexer to produce vibrations in the plurality of flexoelectricity UT transducers;
transmitting a plurality of sound waves towards the part with the PTFE layer, wherein the plurality of sound waves are produced by a combination of the PTFE layer and the vibrations of the plurality of flexoelectricity UT transducers;
receiving a plurality of reflected sound waves from the part with the PTFE layer;
producing a second set of voltages from the plurality of flexoelectricity UT transducers;
receiving the second set of voltages from the plurality of flexoelectricity UT transducers with the multiplexer; and
transmitting pixel data from each flexoelectricity UT transducer to a controller to produce a full image of the part.

13. The method of claim 12, wherein each flexoelectricity UT transducer of the plurality of flexoelectricity UT transducers is a constructed of a flexoelectricity crystal element.

14. The method of claim 13, wherein the flexoelectricity crystal element is a Barium Titanate (BaTiO$_3$) crystal element.

15. The method of claim 13, wherein
each flexoelectricity UT transducer comprises a plurality of flexoelectricity crystal elements arranged in a stacked-up structure, and
wherein producing a second set of voltages from the plurality of flexoelectricity UT transducers includes producing a sub-set of voltages from each flexoelectricity crystal element of each flexoelectricity UT transducer.

16. The method of claim 15, wherein
the multiplexer is in signal communication with each flexoelectricity UT transducer of the plurality of flexoelectricity UT transducers, and wherein receiving the second set of voltages from the plurality of flexoelectricity UT transducers with the multiplexer includes receiving the sub-set of voltages from each flexoelectricity crystal element of each flexoelectricity UT transducer.

17. The method of claim 12, wherein transmitting a plurality of sound waves towards the part with the PTFE layer includes
   producing the plurality of sound waves from a combination of the PTFE layer and the vibration of a first sub-plurality of the flexoelectricity UT transducers,
   receiving the plurality of reflected sound waves from the part with the PTFE layer, and
   producing the second set of voltages from a second sub-plurality of flexoelectricity UT transducers.

18. The method of claim 17, wherein the first sub-plurality of the flexoelectricity UT transducers have a pattern within the two-dimensional array.

19. The method of claim 12, further including receiving with the controller pixel data from each flexoelectricity UT transducer and, in response, produce a full image of the part under inspection.

20. The method of claim 12, wherein the first set of voltages are less than approximately 80 volts.

* * * * *

UNITED STATES PATENT AND TRADEMARK OFFICE
CERTIFICATE OF CORRECTION

| | |
|---|---|
| PATENT NO. | : 11,917,921 B2 |
| APPLICATION NO. | : 17/580404 |
| DATED | : February 27, 2024 |
| INVENTOR(S) | : Morteza Safai |

It is certified that error appears in the above-identified patent and that said Letters Patent is hereby corrected as shown below:

In the Specification

Column 4, Lines 10-12, change "operations described in the memory and other devices" to --operations described in the present disclosure. The one or more processors are adapted to interface and communicate with the memory and other devices--.

Column 7, Line 47, change "Nis the number of" to --N is the number of--.

Signed and Sealed this
Thirtieth Day of April, 2024

Katherine Kelly Vidal
*Director of the United States Patent and Trademark Office*